United States Patent [19]

Kobayashi et al.

[11] 4,059,828
[45] Nov. 22, 1977

[54] BUBBLE LATTICE FILE STRUCTURE

[75] Inventors: Tsutomu Kobayashi, Placentia; John L. Archer, Orange; Michael T. Elliott, Balboa Island, all of Calif.

[73] Assignee: Rockwell International Corporation, El Segundo, Calif.

[21] Appl. No.: 715,967

[22] Filed: Aug. 20, 1976

[51] Int. Cl.² .............................................. G11C 19/08
[52] U.S. Cl. .......................................... 365/32; 365/23
[58] Field of Search .................................. 340/174 TF

[56] References Cited

U.S. PATENT DOCUMENTS

| 3,968,481 | 7/1976 | Grundy et al. | 340/174 TF |
| 3,996,571 | 12/1976 | Chang | 340/174 TF |

OTHER PUBLICATIONS

IBM Technical Disclosure Bulletin, vol. 17, No. 11, Apr. 1975, pp. 3466–3467.

Primary Examiner—James W. Moffitt
Attorney, Agent, or Firm—L. Lee Humphries; H. Fredrick Hamann; G. Donald Weber, Jr.

[57] ABSTRACT

In an improved bubble lattice file (BLF) structure, two adjacent layers of magnetic bubble domain material are utilized to provide separate media for supporting carrier bubbles or coded bubbles. The coded bubbles, in one layer, represent data stored in the bubble lattice file. The carrier bubbles, in another layer, are magnetically coupled to the coded bubbles and are used in manipulation thereof. The magnetic bubble domain layers may be separated by an appropriate interface layer or surface. The lattice file area, or storage area, is biased by a single layer of bias material while adjacent areas, such as an input/output region, include a pair of biasing layers disposed on opposite sides of the adjacent layer structure. This composite permits an improved bubble lattice file structure which utilizes the storage capabilities of bubble lattice file memories as well as the operating capabilities of so-called conventional magnetic bubble domain device techniques.

9 Claims, 3 Drawing Figures

BUBBLE LATTICE FILE STRUCTURE

BACKGROUND

1. Field of the Invention

This invention relates to magnetic bubble domain device structures, in general, and to improved magnetic bubble domain memories using bubble lattice file techniques, in particular.

2. Prior Art

In conventional magnetic bubble domain devices, information is represented by the presence or absence of bubbles and bit positions are defined by device structures such as permalloy T-bar and chevron patterns. However, the storage density of memories using such devices is limited. That is, the domain interactions necessitate a bit separation of at least four bubble diameters, and the minimum dimensions of device structures (which are typically one-half the bubble diameter) place a lower limit on bubble size.

These limitations are relaxed by a new approach called the bubble lattice file (BLF) introduced by Voegeli at the 1974 AIP Conference on Magnetism and Magnetic Materials. In this approach, the bubbles are packed close together in a hexagonal lattice configuration and information is represented by the presence or absence of a pair of Bloch lines within the domain of the bubble. This results in storage densities which, for a given bubble diameter, are up to an order of magnitude greater than for conventional bubble devices. Furthermore, since bit positions are "self-defined," device structures need not be placed at every bit position, thus relaxing lithographic limitations.

A BLF column access system is described by Voegeli et al, in AIP Conference Proceedings, 24, 617 (1974) and Rosier et al, AIP Conference Proceedings, 24, 620 (1974). Basically, the system consists of a storage lattice having n columns of m bubbles, which can be laterally translated, and one or more access channels crossing the storage lattice. Each of these channels contains a shift register for propagating a bubble column and is terminated at opposite ends by read and write stations.

Data is accessed by translating the lattice, either to the left or to the right, until the addressed column is located in the nearest access channel. The bubbles in the addressed column are then propagated along the channel and detected by a suitable detector. The domain pattern remains invariant with translation as buffer columns are inserted and extracted at opposite ends of the storage area, as described in U.S. Pat. No. 3,930,244 by Voegeli.

In known systems, information is represented by the presence (S=0) or absence (S=1) of a pair of Bloch lines within the domain wall of a bubble in a garnet film. The prior art write scheme involves controlling these wall states by a local in-plane field and a critical domain wall velocity. The read function requires discrimination between bubbles with different wall states and sensing by conventional bubble devices. In one approach the discrimination is based on the difference of deflection angles in a field gradient and is inevitably destructive.

Efforts have been made to demonstrate the feasibility of BLF devices. Lattice initialization and translation have been successfully demonstrated using both current access and field access techniques at moderate frequencies. Column translation has been achieved with some degree of success. However, a serious problem encountered is a bias field mismatch between the storage area and the read/write area. Several techniques have been proposed to solve this problem but no satisfactory solution has been reported.

Controllability of the Bloch line wall states has been demonstrated by Hsu, "Control of Bubble Wall States for Bubble Lattice Devices," AIP Conference Proceedings, 24, 624 (1974). However, the stability of these wall states, a key element, in a BLF environment, has not been demonstrated. According to the study performed by Hsu, supra, on isolated bubbles in ion-implanted garnet films, an in-plane field is necessary to stabilize the S=0 state. On the other hand, too large an in-plane field destabilizes the S=1 state. In other words, both the S=0 and S=1 states are "statically" stable in a certain range of in-plane field. Radial and translational bubble motion narrows the stability range. If either the radial wall velocity or the translational bubble velocity reaches the respective critical value, the stability range for the wall states vanishes. The stability range also decreases with increasing temperature. Furthermore, the stability of the wall states may be more sensitive to garnet defects than are other properties such as coercivity. In short, the stability of the wall states is intrinsically much poorer than that of the bubble itself. This casts a serious doubt as to whether this information coding scheme is viable. Moreover, as mentioned earlier, non-destructive read-out does not seem possible with this coding scheme.

SUMMARY OF THE INVENTION

The instant invention is directed to an improved magnetic bubble domain storage structure and a new coding scheme to be used therewith. The structure comprises a composite film capable of supporting two magnetic bubble domains in vertical alignment. In one embodiment, the film comprises two magnetic layers separated by an intermediate surface or layer. Information to be stored in the memory is represented by the presence or absence of coding bubbles in one of the layers. The coded bubbles are manipulated by carrier bubbles which are closely packed in a hexagonal lattic configuration in the other layer. A first biasing layer is disposed adjacent to the information carrying (coded bubble) layer. This first biasing layer is contiguous with substantially all of the system utilizing the memory area. A second biasing layer is disposed adjacent to the control (carrier bubble) layer in the areas of the conventional bubble domain device operation, such as input/output regions or the like, but dpes not cover the lattice file storage area.

DESCRIPTION OF THE PREFERRED EMBODIMENT

Figure 1:
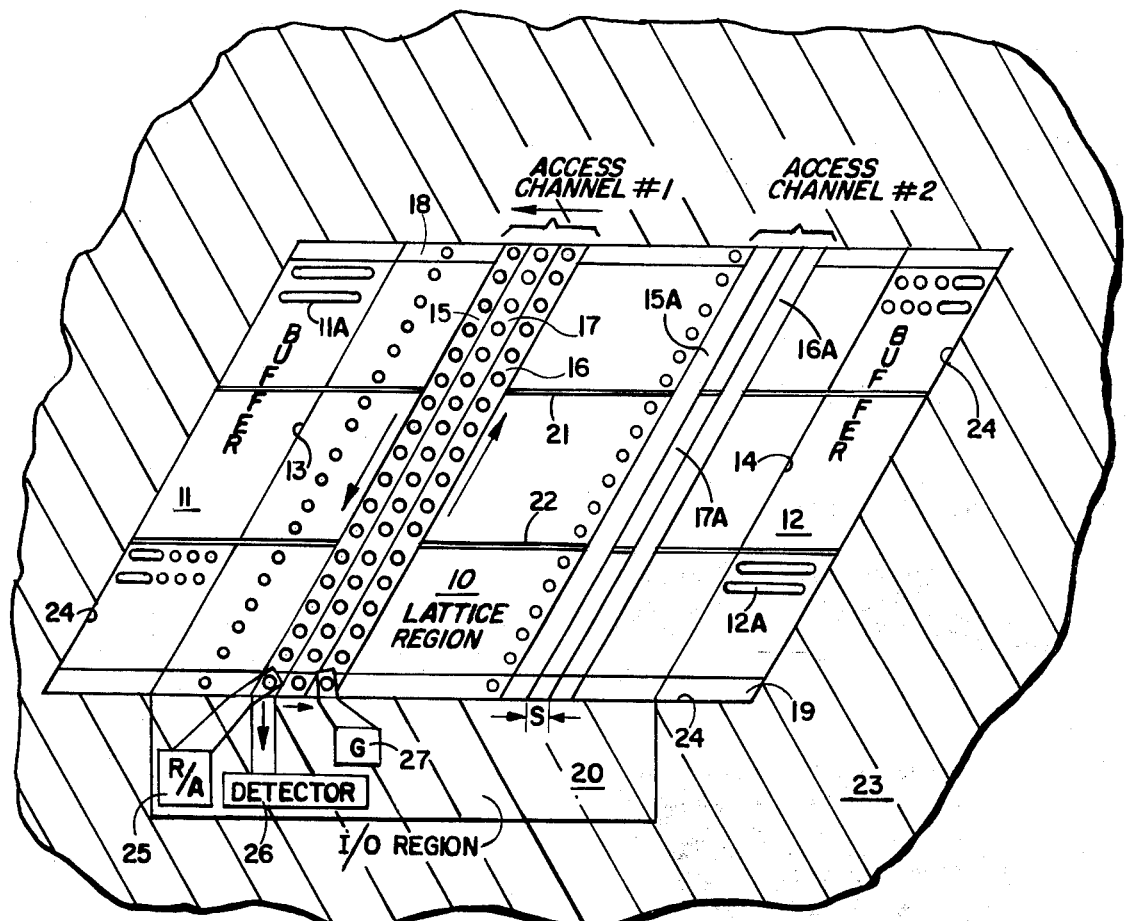
FIG. 1 is a schematic diagram of a self-biased, bubble lattice file structure contemplated by the instant invention.

Referring now to FIG. 1, there is shown a top view of a self-biased bubble lattice (BLF) structure which can be fabricated in accordance with the instant invention. This structure is, generally, the configuration shown and described in, inter alia, U.S. Pat. No. 3,930,244 to Voegeli, noted supra. This view, taken normal to the plane of the figure, shows a bubble lattice file structure which is substantially trapezoidal in shape. The structure includes the bubble lattice region 10 which includes, adjacent thereto, buffers 11 and 12 at opposite ends thereof. Buffers 11 and 12 are of the type described in the aforementioned Voegeli patent and include cylindrical or strip bubbles 11A and 12A, respectively, for translating the bubble columns to the access channels. The information storage area of lattice structure 10 is essentially located between the lines 13 and 14 which represent the interface locations between the lattice 10 and the buffer zones.

Access channels 1 and 2 are disposed transverse to the BLF structure and include channel columns 15, 16 and 17 as well as columns 15A, 16A and 17A, respectively. In particular, channel columns 15 and 16 are utilized to propagate bubbles therealong in the direction indicated by the adjacent arrows. Channel columns 17 and 17A are indicated as being single columns. However, channels 17 and 17A are defined as having a width s which can be any number of columns which are required or desired in order to optimize operation of the device.

The outer periphery of the lattice storage region 10 of the BLF structure is defined by edges 24 of biasing layer 23 (described in more detail hereinafter) which surrounds the lattice region. Dams 21 and 22 may be constructed of a narrow strip of material similar to layer 23. Consequently, the dams can be produced while the lattice region is fabricated, through masking or etching or the like. Dams 21 and 22 serve to maintain row alignment of the bubbles in the columns.

At the edges of lattice region 10, there are provided dummy rows 18 and 19. The dummy rows are provided to store a plurality of bubble domains. This arrangement permits greater flexibility and control than the strip bubbles of the buffer zones, especially in the area of the access channels. Generally, except in the area of the access channels, the bubbles in the dummy rows are relatively immobile. The bubbles in the dummy row (in the area of the access channels) are free to move. In fact, these bubbles are part of the information stored in the lattice region.

Input/output (I/O) region 20 is defined adjacent to lattice region 10 on layer 23. Replicator/annihilator 25 is coupled to a portion of channel 15 of access channel 1. Likewise, generator 27 is coupled to a portion of channel 16. Detector 26 is coupled to channels 15, 16 or 17 as desired. Of course, the generator, replicator/annihilator and/or detector can be arranged in any suitable fashion at any appropriate location relative to the access channels. Also, these components may be of any desirable configuration and may be active or passive as desired. Moreover, a separate I/O region may be established relative to each access channel wherein parallel outputs of several information channels may be selectively achieved in order to provide a multiplexing arrangement or the like.

In general, the operation of the BLF structure shown in FIG. 1 is typically the same as in known structures. Thus, buffers 11 and 12 can be manipulated to cause a column of bubbles to be transferred to an access channel, e.g. channel #1. Depending upon the desired operation, the bubbles are transferred to channel column 15 or 17. Of course, channel 15 provides faster access time for output information. The bubbles are then propagated along channel 15 by means of the preffered current or field access mechanisms. Replicator 25 causes the bubble to be replicated whereby one bubble proceeds around the loop and into channel column 16 via dummy row 19. In addition, a replicated bubble is propagated through detector 26. Consequently, nondestructive readout can be achieved. Generator 27 operation is typical and supplies input bubbles to channel column 16.

The placement of the I/O region 20 adjacent to lattice region 10 on bias layer 23 permits improved coding arrangements and utilization arrangements described in detail hereinafter. Moreover, the difficulties and disadvantages, e.g., transfer of information from the lattice region to the conventional region, frequently encountered in existing structures of this type are avoided by utilization of the BLF structure described in more detail in FIG. 2.

Figure 2:
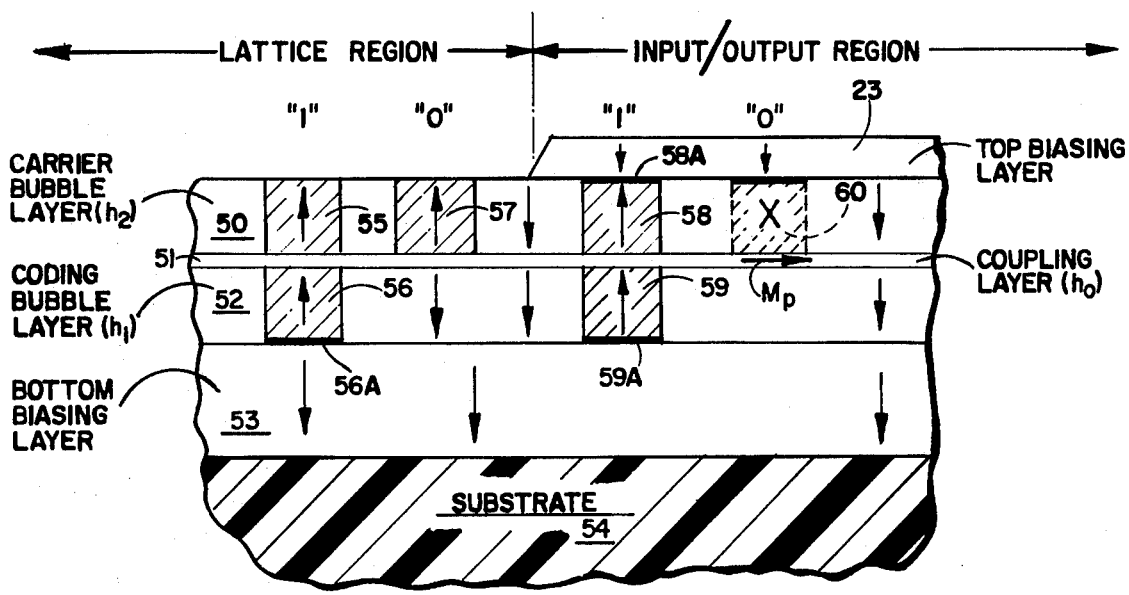
FIG. 2 is a cross-section of a portion of the self-biased bubble lattice structure of the instant invention.

Referring now to FIG. 2, there is shown a cross-section of a portion of BLF structure shown in FIG. 1. In the self-biased BLF structure shown in FIG. 2, a suitable substrate 54 is utilized. This substrate may be formed of single crystal gadolinium gallium garnet ($G^3$), for example. The bottom biasing layer 53 is formed on a surface of substrate 54 in a suitable manner. Bottom biasing layer 53 may be formed of $(EuEr)_3(FeGa)_5O_{12}$ or similar type of magnetic bubble domain material and may be formed by epitaxial, CVD or any other suitable procedure. Many types of material and processes are known in the art and any suitable ones may be utilized. Bottom biasing layer 53, however, is chosen to have an extremely high anisotrophy field ($H_K$). Thus, when saturated in one direction, as suggested by the arrows, layer 53 will remain saturated until a field greater than $H_{K_u}$ is applied in the opposite direction. This layer supplies an effective bias field to the remainder of the BLF structure as noted supra.

Coded bubble layer 52 of magnetic bubble domain material of the type suitable for supporting bubbles is formed on a surface of layer 53 using any suitable procedure. Again, any suitable material or process, many of which are known, may be utilized.

Carrier bubble layer 50 is formed on coding bubble layer 52 in a suitable manner, such as by using LPE or CVD techniques. Layer 50 is formed of magnetic bubble domain material which may have characteristics similar to layer 52.

Top biasing layer 23, as shown in FIG. 1, is formed over portions of carrier bubble layer 50 to provide a biasing layer relative to layer 50. The characteristics of top biasing layer 23 are similar to those of layer 53.

A separate layer 51 may, in some embodiments, be disposed between carrier bubble layer 50 and coded bubble layer 52. Intermediate layer 51 may represent an epitaxially grown gadolinium gallium garnet ($G^3$) layer, a non-magnetic layer or a layer having a planar magnetic vector, Mp.

It should be understood that the specific types of materials or processes do not form a portion of the invention, per se. Thus, the recitation of such materials or processes is illustrative only and is not intended to be limitative. Any suitable process or material is contemplated.

The coding scheme permitted by utilization of appropriate material permits the selective provision of magnetic bubbles in respective layers 50 and 52. Layer 50, the carrier bubble layer, will typically include a large plurality of bubbles which are, essentially, closely packed in the BLF structure. These bubbles are the bubbles which are moved in response to the operation of the BLF structure shown in FIG. 1. Carrier bubbles such as 55, 57 and 58 are used to transport coded bubbles such as 56 and 59 through the structure. Bubbles 56 and 59, when magnetically coupled to the carrier bubble, provide what is called a "double bubble" which represents a binary one. Carrier bubbles without a coding bubble in layer 52, are called "half bubbles" and represent a binary zero, (see bubble 57). Thus, the distinct advantage of coding based on the presence or absence of a coding bubble rather than Bloch wall characterisitcs is achieved.

In order to establish a useful device, it is necessary to define a structure (FIGS. 1 and 2) wherein the double bubble remains stable in both the BLF and I/O regions and the half bubble remains stable in the BLF region but may collapse in the I/O region. Moreover, the double and half bubbles must have essentially the same diameter in the BLF region to form a uniform lattice. These requirements, i.e., stability and lattice uniformity, are described in conjunction with FIGS. 2 and 3.

Figure 3:
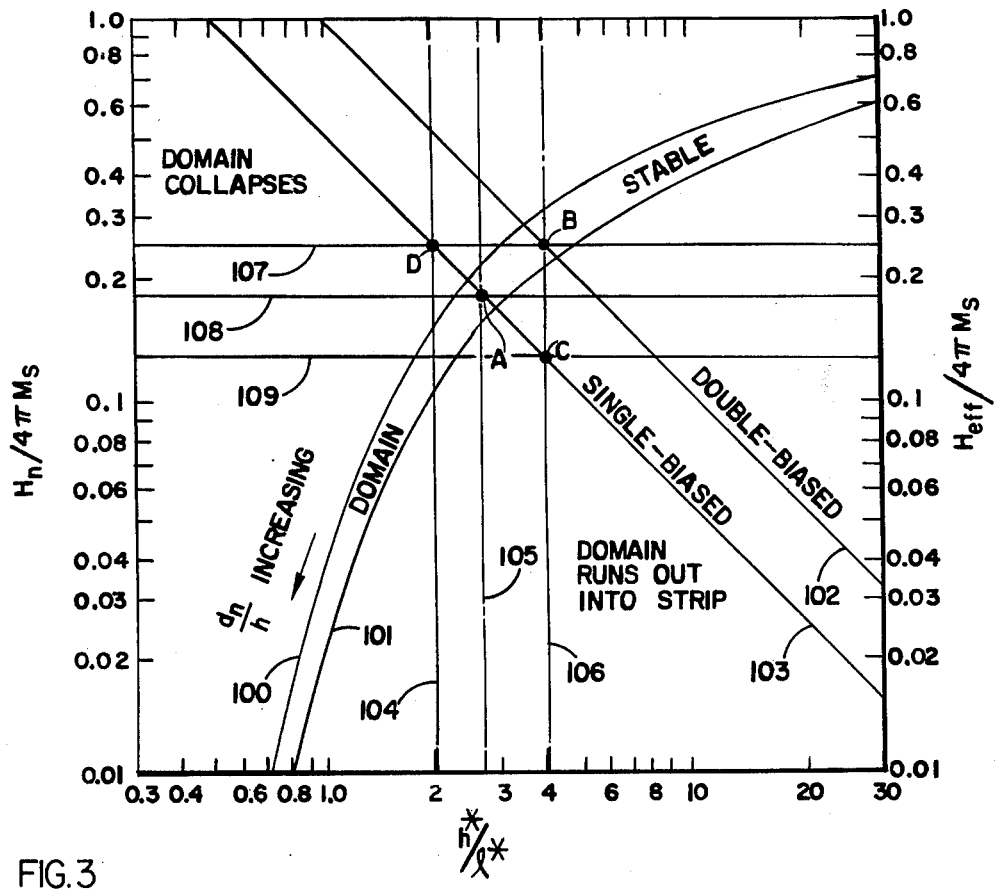
FIG. 3 is a graph which shows the effective bias field and the bubble stability range as a function of the ratio of the effective thickness to the effective material characteristic length, $h^*/l^*$, for the instant invention.

Referring now to FIG. 3, there is shown a chart which defines the effective bias field and the bubble stability range versus $h^*/l^*$. Here, $h^*$ and $l^*$ denote the "effective" values of the thickness ($h$) and the characteristic length ($l$) appropriate for various types of bubbles such as the double and half bubbles. In this chart, the region in which magnetic bubble domains are stable is located between lines 100 and 101. In the region above and to the left of line 100, magnetic bubble domains collapse in response to the bias field. Conversely, below and to the right of line 101, bubble domains run into strips in response to the applied field.

Lines 102 and 103 represent the effective bias field $H_{eff}/4\pi M_S$ supplied by the double biased and single biased structures, respectively. The double biased structure is the structure shown in the I/O region 20 of FIGS. 1 and 2 including biasing layers 53 and 23. The single biased structure is represented by region 10 in FIGS. 1 and 2 and includes only biasing layer 53. The values of lines 100, 101, 102 and 103 are, largely, similar for most magnetic bubble domain structures of this type.

Vertical lines 104, 105 and 106 are lines which project typical values for $h^*/l^*$. In particular, line 104 represents the $h^*/l^*$ (e.g. 2) value for a half-bubble (height $h_2$) while line 106 represents the $h^*/l^*$ value (e.g. 4) for a double bubble (height approximately $h_1 + h_2$). Horizontal lines 107, 108 and 109 represent typical values of $H_{eff}/4\pi M_S$. These values represent the fields at which lines 102 and 103 (bias lines) intersect the characteristic lines 104, 105 and 106. It is seen in the chart of FIG. 3 that line 103, which represents a single biased structure, produces three intersections with the $h^*/l^*$ lines. These intersections A, C and D, represent a stable domain region, a strip-out region and a collapse region depending upon the values of $h^*/l^*$. Likwise, line 102 which intersections with the $h^*/l^*$ lines. However, only intersection B, a stable domain region, is of concern in this description. That is, in order to establish a useful device, it is necessary to define a structure (FIGS. 1 and 2) wherein double bubbles remain table in both the single and double biased regions. Conversely, a half-bubble must remain stable in the single biased region but may collapse in the double biased region as described infra.

Concurrent reference is now made to FIGS. 1, 2 and 3 in order to better define the inventive apparatus and operation thereof. In known systems in the prior art, the viability of the coding scheme utilizing wall states is highly questionable. The approach described herein utilizes a composite structure consisting of two bubble supporting magnetic layers 50 and 52 which may be separated by layer 51. Information is represented by the presence or absence of bubbles in the bottom layer ("coding bubbles") and manipulated by the bubbles in the top layer ("carrier bubbles") which are packed close together in a hexagonal lattice configuration.

In a preferred embodiment, bubble supporting layers 52 and 50 have thickness $h_1$ and $h_2$, respectively, separated by layer 51 of thickness $h_o$ where $h_o$ may shrink to 0. Layer 51 may be nonmagnetic or magnetic material as described hereinafter. Though not required, for simplicity, it is assumed that the two magnetic layers have the same material parameters except thickness. If layer 51 is sufficiently thin ($h_o < < h_1 + h_2$), a double bubble (55 and 56) behaves like a single bubble with effective thickness $h^* \leq h_1 + h_2$ because of a strong magnetostatic interaction between the two layers. In other words, the bubble diameter-versus-bias field relationship for the double bubble is almost identical with that of a single bubble of height $h^* \leq h_1 + h_2$. Moreover, the double bubble can be manipulated (i.e., generated, annihilated, replicated, etc.) in devices in much the same way as a single bubble. On the other hand, a half bubble (57) behaves exactly like a single bubble of thickness $h^* = h_2$. Thus, a double bubble (binary 1) and a half bubble (binary 0) can be used to represent binary digits as suggested in FIG. 2.

In a typical BLF storage, carrier bubbles of layer 50 are packed close together to form a hexagonal bubble lattice, while coding bubbles of layer 52 are distributed randomly-with some bubbles more or less isolated (but still coupled with their respective carrier bubbles) and other bubbles more closely packed. Hexagonal close packed (hcp) carrier bubbles are stable without an external bias field. That is, the inter-bubble forces are sufficient to maintain these bubble domains and to prevent same from stripping out. However, isolated coding bubbles (e.g. 56 or 59) will strip out under no-bias conditions unless layers 51 and 52 are much thinner than layer 50. Unfortunately, making layer 52 much thinner than layer 50 is undesirable inasmuch as this results in double and half bubbles having properties which are so similar that a binary "1" and "0" are almost indistinguishable. If the above conditions are not met, an external bias field can stablilize isolated coding bubbles. In this case, however, the diameter of the double bubble would be considerably larger than that of the half bubble unless layer 51 is thick enough to weaken the magnetostatic coupling between the carrier bubble (e.g. 55) and the coding bubble e.g. 56). Making the magnetostatic coupling weak would have an undesirable effect on the unity of the double bubble. In this case, external disturbances, such as pulsed gradient fields, would tend to separate the coding bubble from its partner carrier bubble.

The present invention solves the above problems by placing biasing layer 53 underneath coding layer 52. It can be shown that by proper choice of $h_o$, $h_1, h_2, l$, and lattice packing density, not only can the isolated double bubble be stablized completely, but also the half-bubble and the double bubble can have essentially the same diameter, i.e., lattice uniformity can be realized. That is, lattice region 10 is partially biased by bottom biasing layer 53 to permit formation of bubbles as described. In addition, in order to make the BLF device completely compatible with input/output region 20, where conventional techniques are used, biasing layer 23 is placed atop I/O region 20 so that the double bubble in this region is fully biased as shown in FIG. 3.

For the single-biased case the effective bias field $H_{eff}$ supplied by biasing layer 53 is approximately $l/2h^*$. This relation is plotted as line 103 in FIG. 3. Also plotted in FIG. 3 is the bubble stability range as a function of $h^*/l^*$. For a single-biased bubble to be fully self-biased and stable, as at point A, the $h^*/l^*$ ratio is about 2.8. For $2.5 \le h^*/l^* \le 3$, the stable, self-biased point is located between lines 100 and 101.

If additional biasing layer 23 is placed on top of the bubble supporting layer, the biasing power is essentially doubled and the effective bias field is approximately $l^*/h^*$. This relation is plotted as line 102 in FIG. 3. It can be seen that for the double biased case, the $h^*/l^*$ ratio for full self-biasing and stability (point B) is about 4. Again, different ratios define different stability points.

Referring now to FIGS. 2 and 3, if $$h_1/l \approx h_2/l \approx 2, \text{ and } h_o < < h_1 + h_2$$

the double bubble (55 and 56) behaves as a single bubble with $h^*/l^* \approx 4$ and is only partially biased (point C in FIG. 3) because it is contiguous with biasing layer 53 only. This partial biasing is sufficient to keep the coding bubble 56 from stripping out, since it corresponds to overbiasing (point D in FIG. 3) for a half bubble having $h_1/l \le 2$ and not coupled to a partner carrier bubble. In other words, half bubble 56 would collapse if it were not magnetically coupled to the partner carrier bubble 55. On the other hand, bubble 55 cannot strip out because of the bubble packing in layer 50. Thus, this partial biasing by biasing layer 53, in conjunction with the field produced by the bubbles in lattice layer 50, is just sufficient to stabilize the double bubble (e.g., at point A in FIG. 3) under the bubble lattice of layer 50. On the other hand, since a single carrier bubble, e.g., bubble 57, is not coupled to bottom biasing layer 53, it is not biased at all in the lattice region. In other words, only the double bubble is "selectively" biased. The selective biasing is established by the magnetic capping wall 56A which is established in bubble 56 in response to layer 53. Nevertheless, single carrier bubble 57 remains stable in the lattice region because of the effect of the other bubble in that region.

However, when a bubble column is pulled out to I/O region 20, using a current access column translation or similar technique, a double bubble is just fully self-biased (point B in FIG. 3) because of the combined effect of layers 53 and 23. These layers create the capping walls 58A and 59A in the double bubble. The combined effect of these layers and capping walls is to bias double bubble 58/59 to point B as noted. On the other hand, the single carrier bubble 60 spontaneously collapses. That is, bubble 60, with $h^*/l^* \approx 2$, is single biased by the contact with layer 23 and is definitely over-biased (point D in FIG. 3). Consequently, a bit pattern composed of double bubbles and half bubbles in lattice region 10 is automatically converted to the equivalent bubble-no bubble pattern in I/O region 20. Also, inasmuch as double biased layer 23 surrounds lattice region 10, it services as lattice confinement.

The double biasing scheme described herein can also be used in conventional, single bubble systems. The double biasing scheme has the advantage therein that the $h^*/l^*$ ratio of approximately 4 permits optimum bubble diameter/height aspect or ratio. In addition, the double biasing scheme permits the smallest bubble diameter for a given value of $l^*$.

It can be shown that by proper choice of $h_1$, $h_2$, $l$, $s$, and packing density, the single and the double bubbles are indistinguishable in size. For example, the parameter values $$h_1 \approx h_2 \approx 1.1 \mu m,$$

$$l \approx 0.5 \mu m \ h_o \approx 0.1 \mu m$$

and the nearest neighbor distance of 4.5μm, will stabilize a nearly uniform lattice of a mixture of single and double bubbles with $d \sim 3 \mu m$.

If now layer 51 is considered to be magnetic material with a planar magnetic vector $M_p$, it can be shown in a similar fashion to the previous case that the double bubble stability and lattice uniformity can also be achieved for this structure with self-biasing layer 53 at the bottom. To obtain the equivalent bubble diameter and packing density (3 μm bubble and 4.5μm period), the material parameters can be $$l_1 = l_2 = l \approx 0.5 \mu m$$

$$h_1 \approx h_2 \approx 0.9 \mu m$$

$$M_1 \approx M_2$$

$$4\pi m_P \approx 1750G \text{ (e.g., GdYIG)}$$

$$h_o \approx 0.01 \mu m$$

If preferred, $h_o$ can be made 0.1 μm, as in the previous case whereupon $4\pi M_p$ can also be reduced. One advantage of the structure including layer 51 over the magnetostatically coupled structure is that hard bubbles in layer 50 are suppressed by planar magnetization layer 51 so that other treatments such as ion-implantation are unnecessary. Hard bubbles are absent in layer 52 (regardless of the nature of layer 51) because of biasing layer 53.

In an exchange-coupled structure, layer 51 is effectively omitted.

In order for the "half" and "double" bubbles to coexist $$\sigma_{w2} \le \sigma_{w1} \text{ and/or } M_1 < M_2$$

has to be satisfied. It is also desirable to have self-biasing layer 53 at the bottom to stabilize the double bubble in the lattice region 10 in the absence of an external bias field.

It is apparent that the bubble coding scheme can be incorporated into structures having two bubble layers and selective biasing established by appropriate biasing layer. The intermediate layer between the two bubble layers does not alter the overall effect but may influence the specific materials, dimensions or similar characteristics.

Thus, there has been shown and described an improved bubble lattice file structure. The lattice file portion stores coded bubbles in the standard hexagonal lattice format. Carrier or manipulating bubbles are stored in a carrier layer to control movement of the coded bubbles. The advantages of high density storage in a lattice structure are achieved. In addition, by properly choosing the characteristics of the bubble layers, and applying bias layers to the structure in appropriate places, the coded bubbles can be converted to a bubbleno-bubble coding configuration. Moreover, bubbles of substantially the same characteristic such as diameter and stability can be produced in the bubble lattice region and in so-called conventional bubble device structures. The bubble-no-bubble coding scheme avoids the stability problems encountered in prior art schemes. Thus, the advantages of a lattice file and conventional structures are utilized while the disadvantages of each of these schemes are avoided.

In the preferred embodiment shown, layer 51 is disposed between the carrier and coding bubble layers 50 and 52, respectively. Layer 51 can be fabricated of non-magnetic material, magnetic material with a planar magnetic vector or this layer can be eliminated altogether and an inter-layer surface can be utilized. Also, while $h_2$ and $h_1$ have been discussed as being approximately equal, it may be desirable to have $h_2 > h_1$. This arrangement permits controlled collapse of carrier bubbles in the I/O region. Of course, other appropriate modifications can be made to the respective bubble layers in order to improve bubble stability and other operational features. However, any modifications along these lines are intended to be included within this description. This description is not intended to be limitative of the invention. Rather, the scope thereof is defined by the claims appended hereto.

Having thus described the preferred embodiment of the instant invention, what is claimed is:

1. In a magnetic bubble domain storage apparatus,
   a first layer of magnetic bubble domain material for supporting carrier magnetic bubble domains,
   a second layer of magnetic bubble domain material for supporting coded magnetic bubble domains which are coupled to said carrier magnetic bubble domains,
   a first biasing layer supporting said second layer of magnetic bubble domain material and for applying a first magnetic bias field to said second layer of magnetic bubble domain material to affect the coded magnetic bubble domains formed therein, and
   a second biasing layer supported by at least portions of said first layer of magnetic bubble domain material in order to apply a second magnetic bias field to interact with said first magnetic bias field to affect the magnetic bubble domains formed in said first and second layers of magnetic bubble domain materials.

2. The apparatus recited in claim 1 including
   a substrate layer supporting said first biasing layer.

3. The apparatus recited in claim 1 including
   buffer means for selectively moving said magnetic bubble domains in a first direction.

4. The apparatus recited in claim 3 including
   means for moving said magnetic bubble domain in a second direction transverse to said first direction, and
   detector means for detecting magnetic bubble domains which have moved in said second direction,
   said detector means disposed on said second biasing layer.

5. The apparatus recited in claim 1 including
   generating means for producing magnetic bubble domains,
   replicate means for replicating magnetic bubble domains, and
   annihilator means for annihilating magnetic bubble domains,
   said generator means, said replicate means and said annihilator means disposed on said second biasing layer.

6. The apparatus recited in claim 1 including
   a layer of non-magnetic material interposed between said first and second layers of magnetic bubble domain material.

7. The apparatus recited in claim 1 including
   a layer of planar-magnetic material interposed between said first and second layers of magnetic material.

8. The apparatus recited in claim 1 wherein
   said first and second layers of magnetic material having substantially the same material parameters.

9. The apparatus recited in claim 1 wherein
   said second layer of magnetic material is thin relative to said first layer of magnetic material.

* * * * *